US009460969B1

(12) United States Patent
Cai et al.

(10) Patent No.: US 9,460,969 B1
(45) Date of Patent: Oct. 4, 2016

(54) MACRO TO MONITOR N-P BUMP (71) Applicants: International Business Machines Corporation, Armonk, NY (US); Globalfoundries, Inc., Grand Cayman (KY); STMicroelectronics, Inc., Coppell, TX (US)

(72) Inventors: Xiuyu Cai, Niskayuna, NY (US); Qing Liu, Watervliet, NY (US); Ruilong Xie, Niskayuna, NY (US); Chun-Chen Yeh, Clifton Park, NY (US)

(73) Assignees: INTERNATIONAL BUSINESS MACHINES CORPORATION, Armonk, NY (US); GLOBALFOUNDRIES INC., Grand Cayman (KY); STMICROELECTRONICS, INC., Coppell, TX (US)

( * ) Notice: Subject to any disclaimer, the term of this patent is extended or adjusted under 35 U.S.C. 154(b) by 21 days.

(21) Appl. No.: 14/669,055

(22) Filed: Mar. 26, 2015

(51) Int. Cl.
| H01L 21/66 | (2006.01) |
| H01L 21/8238 | (2006.01) |
| H01L 21/768 | (2006.01) |
| H01L 21/308 | (2006.01) |
| H01L 21/306 | (2006.01) |

(52) U.S. Cl.
CPC ... *H01L 21/823871* (2013.01); *H01L 21/3085* (2013.01); *H01L 21/30625* (2013.01); *H01L 21/76885* (2013.01); *H01L 21/76897* (2013.01); *H01L 21/82385* (2013.01); *H01L 22/12* (2013.01)

(58) Field of Classification Search
CPC ....... H01L 22/34; H01L 22/12; H01L 22/20; H01L 22/26
See application file for complete search history.

(56) References Cited

U.S. PATENT DOCUMENTS

| 5,962,867 A | 10/1999 | Liu |
| 6,528,818 B1* | 3/2003 | Satya ................ G01N 21/66 |
| | | 257/48 |
| 6,815,235 B1 | 11/2004 | Markle |
| 7,067,335 B2* | 6/2006 | Weiner ............ G01N 21/9501 |
| | | 324/754.21 |
| 7,538,344 B2* | 5/2009 | Mellinger .......... G03F 7/70633 |
| | | 257/48 |
| 7,772,867 B2 | 8/2010 | Guldi et al. |
| 7,800,106 B2* | 9/2010 | Feustel ................ H01L 22/34 |
| | | 257/48 |
| 7,807,996 B2 | 10/2010 | Cho et al. |
| 8,629,435 B2* | 1/2014 | Tsai ...................... G01B 7/082 |
| | | 257/48 |
| 9,082,739 B2* | 7/2015 | Su ....................... H01L 22/34 |
| 9,159,633 B2* | 10/2015 | Yamashita ............ H01L 22/10 |
| 2006/0046441 A1 | 3/2006 | Miyano et al. |
| 2009/0273036 A1 | 11/2009 | Horstmann et al. |
| 2013/0065329 A1 | 3/2013 | Kronholz et al. |

* cited by examiner

*Primary Examiner* — John C Ingham
(74) *Attorney, Agent, or Firm* — Cantor Colburn LLP; Vazken Alexanian (57) ABSTRACT

A technique relates to fabricating a macro for measurements utilized in dual spacer, dual epitaxial transistor devices. The macro is fabricated according to a fabrication process. The macro is a test layout of a semiconductor structure having n-p bumps at junctions between NFET areas and PFET areas. Optical critical dimension (OCD) spectroscopy is performed to obtain the measurements of the n-p bumps on the macro. An amount of chemical mechanical polishing is determined to remove the n-p bumps on the macro based on the measurements of the n-p bumps on the macro. Chemical mechanical polishing is performed to remove the n-p bumps on the macro. The amount previously determined for the macro is utilized to perform chemical mechanical polishing for each of the dual spacer, dual epitaxial layer transistor devices having been fabricated under the fabrication process of the macro in which the fabrication process produced the n-p bumps.

20 Claims, 12 Drawing Sheets

MACRO TO MONITOR N-P BUMP

BACKGROUND

The present invention relates to semiconductor device manufacturing techniques, and more specifically, to the formation of macros as layouts to monitor a bump formed at the junction of an n-type area and p-type area.

While the planar field effect transistor (FET) may appear to have reached the end of its scalable lifespan, the semiconductor industry has found an alternative approach with FinFETs. FinFET technology is viewed by many as the best choice for next generation advanced processes.

With advanced geometry planar FET technologies, such as 20 nanometer (nm), the source and the drain encroach into the channel, making it easier for leakage current to flow between them and in turn making it very difficult to turn the transistor off completely. FinFETs are three-dimensional structures that rise above the substrate and resemble a fin, hence the name. Certain techniques are utilized to form the fins for n-channel FETs and p-channel FETs.

SUMMARY

According to one embodiment, a method of fabricating a macro for measurements utilized in dual spacer, dual epitaxial transistor devices is provided. The method includes fabricating the macro according to a fabrication process, in which the macro is a test layout of a semiconductor structure having n-p bumps at junctions between NFET areas and PFET areas, and performing optical critical dimension (OCD) spectroscopy to obtain the measurements of the n-p bumps on the macro. The method also includes determining an amount of chemical mechanical polishing to remove the n-p bumps on the macro based on the measurements of the n-p bumps on the macro, and performing chemical mechanical polishing to remove the n-p bumps on the macro. The amount previously determined for the macro is utilized to perform chemical mechanical polishing for each of the dual spacer, dual epitaxial layer transistor devices having been fabricated under the fabrication process of the macro in which the fabrication process produced the n-p bumps.

According to one embodiment, a method of configuring macros for measurements utilized in dual spacer, dual epitaxial transistor devices is provided. The method includes fabricating a first macro as a first test structure having a first type of n-p bumps, obtaining first measurements of the first type of n-p bumps on the first macro, fabricating a second macro as a second test structure having a second type of n-p bumps, and obtaining second measurements of the second type of n-p bumps on the second macro. For first dual spacer, dual epitaxial layer transistor devices formed to have the first type of n-p bumps according to the first macro, the first type of n-p bumps in the first dual spacer, dual epitaxial layer transistor devices are polished according to the first measurements such that the first type of n-p bumps are removed. For second dual spacer, dual epitaxial layer transistor devices formed to have the second type of n-p bumps according to the second macro, the second type of n-p bumps in the second dual spacer, dual epitaxial layer transistor devices are polished according to the second measurements such that the second type of n-p bumps are removed.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A through 2D illustrate fabrication of the transistor structure using the dual spacer, dual epi scheme according to an embodiment, in which:

FIGS. 3A through 3I illustrate a fabrication process of a macro utilized in optical critical dimension (OCD) measurements to characterize n-p bumps according to an embodiment, in which:

DETAILED DESCRIPTION

Dual spacer and dual epitaxial layers (epi) for n-type (n-channel) field effect transistors (NFET) and p-type (p-channel) PFET are utilized to optimize the junction between the n-type and p-type (such as the source/drain) regions, thereby growing the fins (i.e., epitaxial layers) of the finFET device. However, this scheme may introduce a bump region at n-p transition region (such as n-p bumps), which will impact the subsequent process, especially the polysilicon open process for replacement metal gate (RMG). Embodiments provide macros, which are test layout semiconductor structures, for monitoring the size of n-p bumps. By being able to remove the n-p bumps in the macro, embodiments can then remove the n-p bumps in the actual dual spacer, dual epitaxial transistor devices.

Figures 1, 2B:
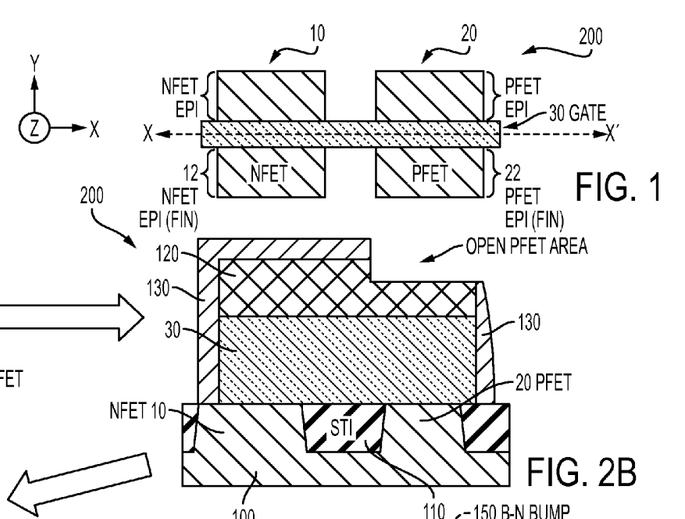
FIG. 1 illustrates a transistor structure having been fabricated with a dual spacer, dual epi scheme according to an embodiment.
FIG. 2B illustrates etching to deposit an NFET epitaxial layer.

Embodiments introduce several new optical critical dimension (OCD) macros to monitor the bump size at n-p transition regions. FIG. 1 illustrates top down view of a transistor structure 200 (i.e., a finFET) having been fabricated with a dual spacer, dual epi scheme according to an embodiment. FIG. 1 illustrates the transistor structure 200 having an NFET area 10 with NFET epitaxial layer 12 (i.e., NFET fin), a PFET area 20 with PFET epitaxial layer 22 (i.e., PFET fin), and a dummy gate 30, while some details are not shown. A cross-sectional view is taken along the line X-X' to illustrate the n-p bump in a fabrication process shown in FIGS. 2A-2D.

FIGS. 2A through 2D illustrate fabrication of the transistor structure 200 (finFET) using the dual spacer, dual epi scheme. In FIGS. 2A through 2D, cross-sectional views are shown along the A-A line in FIG. 1.

Figure 2A:
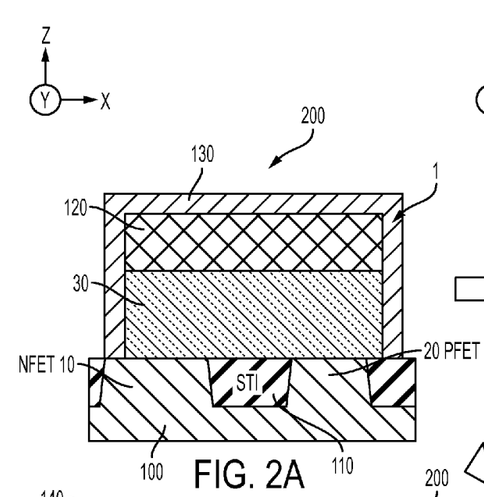
FIG. 2A illustrates a cross-sectional view of the structure.

In FIG. 2A, the structure 200 includes a substrate 100, shallow trench isolation (STI) areas 110, the dummy gate 30, a hardmask 120, and a first spacer 130. FIG. 2A also shows the shallow trench isolation 110 between the NFET area 10 and the PFET area 20 in the substrate 100.

FIG. 2B shows PFET spacer etching of the first spacer 130 and hardmask 120 over the PFET area 20 and epitaxial layer growth on the PFET area 20 (e.g., PFET epitaxial layer 22 (fin) in FIG. 1). Because of the open PFET area, the hardmask 120 is exposed over the PFET area 20 and the PFET area 20 is exposed, while the NFET area 10 remains protected by the first spacer 130. The PFET epitaxial layer 22 is grown to make a fin in finFET technology as understood by one skilled in the art. The PFET epitaxial layer 22 is not shown in the cross-sectional view of FIG. 2B, but the PFET epitaxial layer 22 can be seen in the top down view of FIG. 1.

Figure 2C:
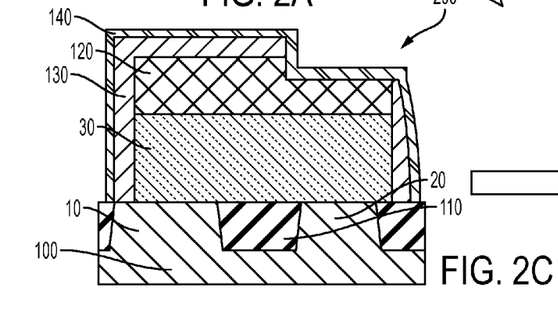
FIG. 2C illustrates depositing a second spacer.

FIG. 2C shows that a second spacer 140 is deposited on top of the transistor structure 200. The second spacer 140 protects the previously grown epitaxial layer 22 of the PFET area 20. Although not shown in the cross-sectional view of FIG. 2C, the second spacer 140 covers the previously grown PFET epitaxial layer 22 in FIG. 1. FIG. 1 shows the view after the second spacer 140 has been removed.

Figure 2D:
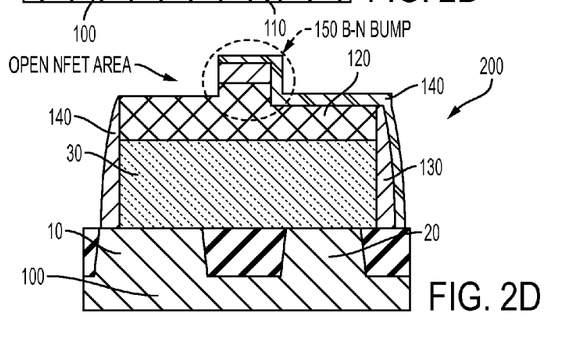
FIG. 2D illustrates etching to deposit PFET epitaxial layer.

FIG. 2D shows NFET spacer etching of the first spacer 130, second spacer 140, and hardmask 120 over the NFET area 10 and epitaxial layer growth on the NFET area 10 (e.g., NFET epitaxial layer 12 (fin) in FIG. 1). The hardmask 120 and the NFET area 10 are exposed in the open NFET area while the PFET area 20 remains protected by the second spacer 140. The NFET epitaxial layer 12 is grown to make the finFET. Although the NFET epitaxial layer 12 is not visible in the cross-sectional view of FIG. 2D, the deposited NFET epitaxial layer 12 can be seen in the top down view in FIG. 1. This dual spacer (i.e., spacers 130 and 140), dual epi scheme (i.e., depositing PFET epitaxial layers and NFET epitaxial layers) causes the formation of an n-p bump 150. The n-p bump 150 is formed at the junction between the NFET area 10 and PFET area 20 as a result of the first spacer 130, second spacer 140 and hardmask 120, along with respective etching. Monitoring the size of this n-p bump 150 is needed and embodiments provide macros and methods to perform the monitoring and subsequent polishing/planarization to remove the n-p bumps 150 according to the macro. It is noted that the NFET area 10 and the PFET area 20 extend in the y-axis, and likewise the spacer layers 130 and 140 and hardmask layer 120 extend in the y-axis to cover the NFET and PFET areas according to the etching in FIGS. 2A-2D, as understood by one skilled in the art.

Figure 6:
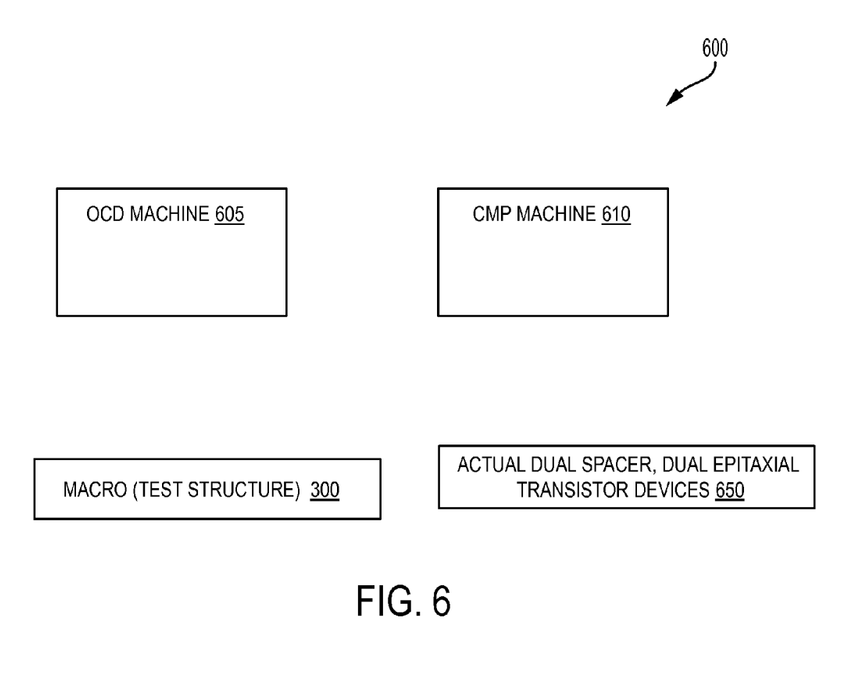
FIG. 6 is a block diagram of a system according to an embodiment.

FIGS. 3A through 3I illustrate a fabrication process of a macro 300 utilized in optical critical dimension (OCD) measurements to characterize the n-p bumps 150 and then remove the n-p bumps 150 in anticipation to utilize the same fabrication process to then fabricate the actual dual spacer, dual epitaxial transistor devices 650 in FIG. 6 according to an embodiment. The macro 300 is a test layout that is utilized for OCD measurement, and the macro 300 generates the same type of n-p bump 150 that is in actual dual spacer, dual epitaxial layer transistor products/devices 650. After polishing, the actual dual spacer, dual epitaxial transistor devices 650 have further processing such as replacement metal gate (RMG) to remove the dummy gate 30, and then the replacement metal gate is deposited in the recesses left from the dummy gates 30, as understood by one skilled in the art.

Once optical critical dimension (OCD) measurements are taken (by OCD machine 605 in FIG. 6) of the n-p bumps 150 in the macro 300 (semiconductor test layout) (such as height (thickness), width, and/or depth), a determination may be made about how much chemical mechanical polishing/planarization (CMP) is needed to remove (planarize) the n-p bump 150. Chemical mechanical polishing/planarization is a process of smoothing surfaces with the combination of chemical and mechanical forces (e.g., by a CMP machine 610 shown in FIG. 6).

Based on the fabrication process of the macro 300, the actual dual spacer, dual epitaxial transistor devices 150 having the NFETs and PFETs using the dual spacer, dual epi scheme are fabricated in massive quantities according to the specification of the macro 300. This results in the actual dual spacer, dual epitaxial layer transistor devices/products 150 having the same dimensions for n-p bumps 150 as the test macro 300, and the CMP machine 610 is set up (using the same specifications as the earlier macro 300) to polish away each of the n-p bumps 150 in the actual dual spacer, dual epitaxial layer transistor products/devices 650. The information collected from the macros 300 may include the spacer thickness on top of gate hardmask 105 and bump 150, gate hardmask thickness erosion 120, and their uniformity respectively across macro 300 (e.g., across the chip). The macro 300 is a chip.

Figure 3A:
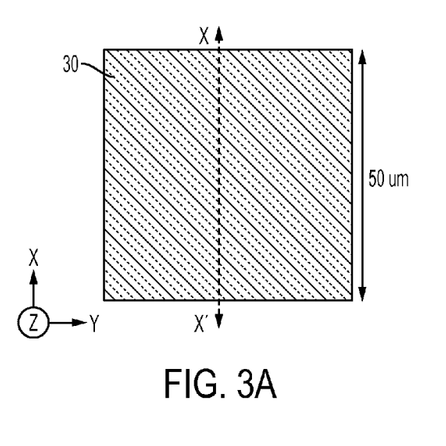
FIG. 3A is a top down view showing a dummy gate covering the substrate.
Figure 3B:
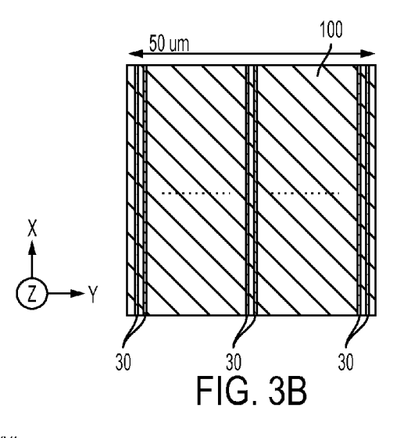
FIG. 3B is a top down view showing gate patterning and etching.

FIG. 3A is a top down view showing the dummy gate layer 30 covering the substrate 100. Cross-sectional views are taken along the X-X' line. FIG. 3B is a top down view showing gate patterning and etching of the dummy gate layer 30. The substrate 100 may be silicon, germanium, silicon-on-insulator (SOI), etc. The dummy gate layer 30 may be polysilicon.

Figure 3C:
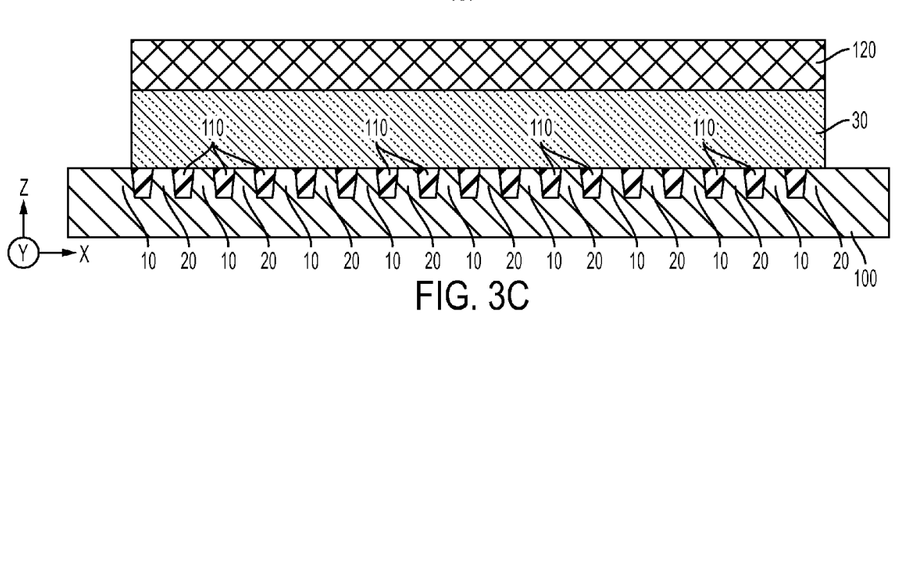
FIG. 3C is a cross-sectional view of the macro with a hardmask on top the macro.

FIG. 3C illustrates a cross-sectional view of the structure with the hardmask 120 deposited on top of the macro 300. The hardmask 120 is patterned and etched. It is noted that the substrate 100 may also include the shallow trench isolation areas 110, the NFET areas 10, and PFET areas 20. The hardmask 120 may be silicon nitride, silicon dioxide, aluminum oxide, and/or hafnium oxide. The thickness (in the z-axis) of the hardmask 120 may be in the range of 30-50 nm.

Figure 3D:
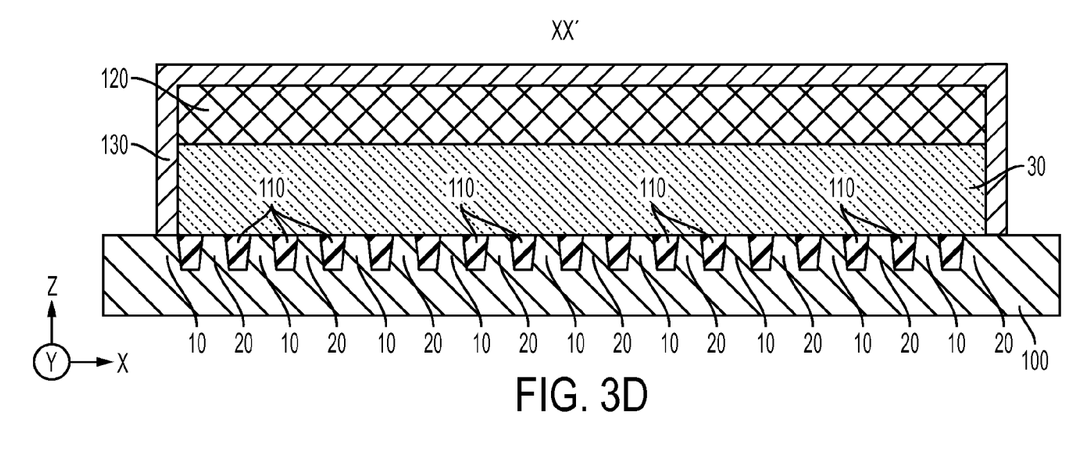
FIG. 3D is a cross-sectional view of depositing the first spacer on the hardmask.

FIG. 3D illustrates a cross-sectional view of depositing the first spacer 130 over the hardmask 120. The first spacer 130 may be silicon nitride. The first spacer 130 may have a thickness of in the range of 8-10 nm.

Figure 3E:
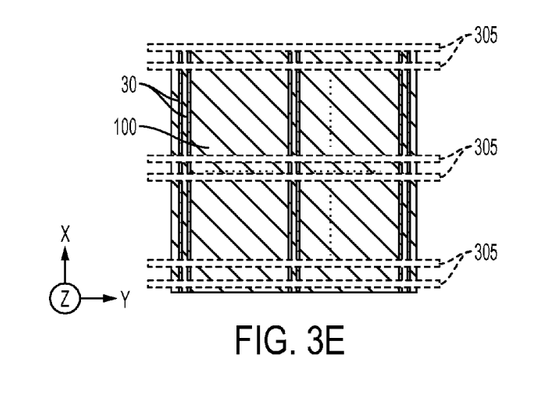
FIG. 3E is an abbreviated top down view that omits certain elements.
Figure 3F:
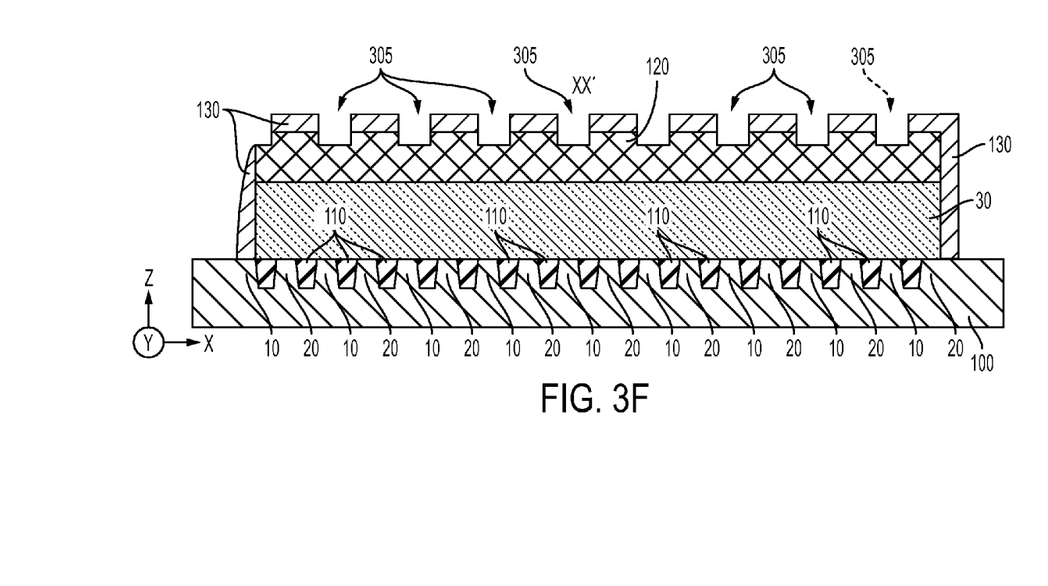
FIG. 3F is a cross-sectional view illustrating opening above PFET regions/areas.

FIG. 3E shows an abbreviated top down view that omits the hardmask 120 and first spacer 130 for clarity. In FIG. 3E, the white stripes are shown as the first spacer etching of the first spacer 130 (and partial etching of the hardmask 120). Correspondingly, FIG. 3F is a cross-sectional view illustrating opening the PFET region/area 20, etching the first spacer 130, partially etching the hardmask 120, and depositing the PFET epitaxial layer 22 (shown in FIG. 1). The recesses 305, where the first spacer 130 is etched way and hardmask 120 is partially etched, in FIG. 3F are represented by the white stripes in FIG. 3E. The etching depth of partially etching in the hardmask 120 may range from 10-15 nm (i.e., even after the first spacer 130 has been etched away). The distance between the recesses 305 (i.e., recess pitch) affects the height of the n-p bumps 150.

Figure 3G:
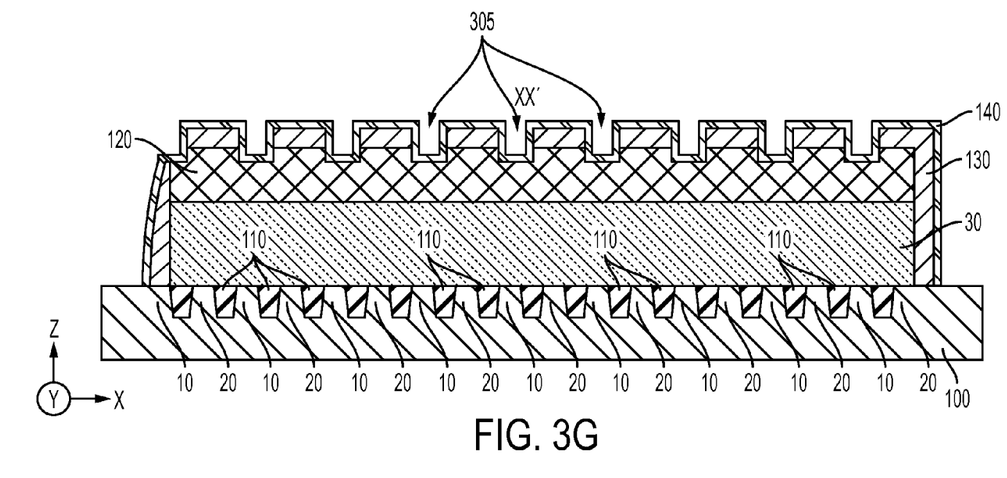
FIG. 3G is a cross-sectional view of depositing a second spacer.

FIG. 3G illustrates a cross-sectional view of depositing the second spacer 140 on top of the macro 300. The second spacer 140 is formed on top of the first spacer 130 and the hardmask 120. The second spacer 140 is also deposited in the recesses 305. The second spacer 140 may be silicon nitride, and the second spacer 140 may have a thickness of in the range of 3-5 nm.

Figure 3H:
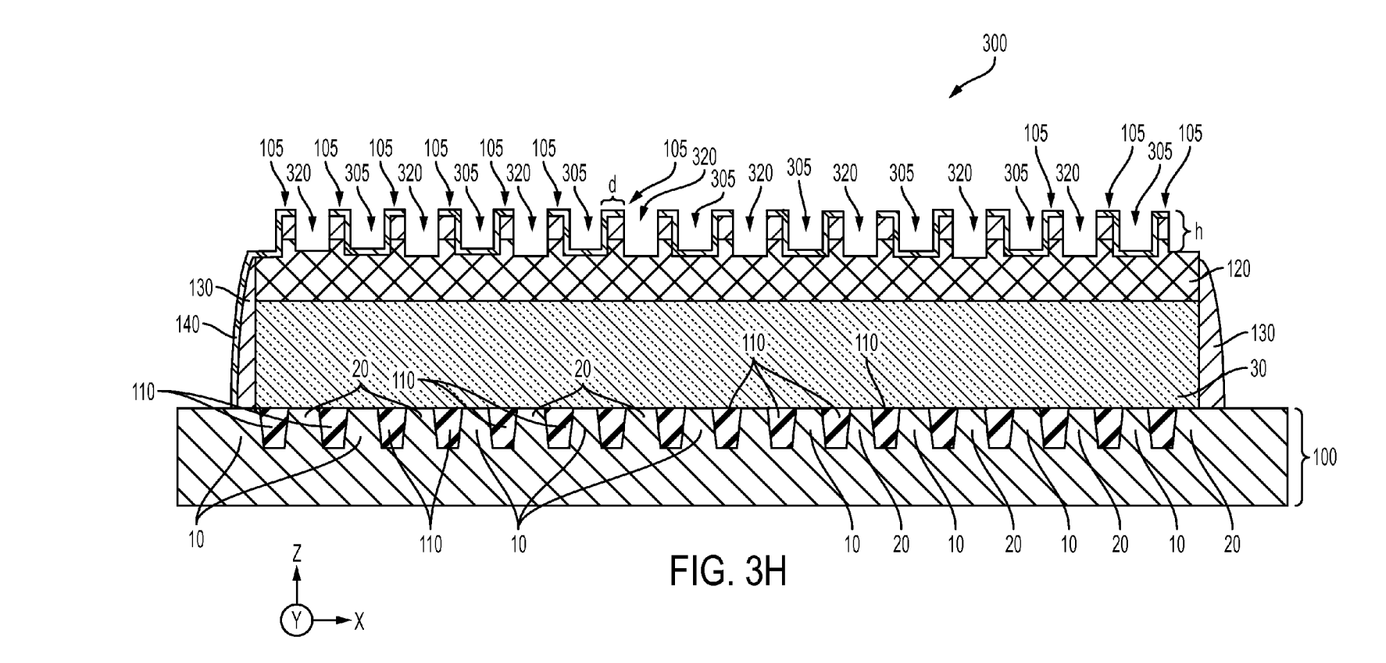
FIG. 3H is a cross-sectional view of opening the NFET regions/areas.

FIG. 3H illustrates a cross-sectional view of opening the NFET region/area 10, by etching the first spacer 130, second spacer 140, and hardmask 120 over the NFET area 10, and then depositing the NFET epitaxial layer 12 (shown in FIG. 1) in the NFET open area 10. In FIG. 3H, the etching creates recesses 320 which do not have the second spacer 140 at the bottom, unlike recesses 305. To form the recesses 320, the first spacer 130 and the second spacer 140 are completely etched while the hardmask 120 is partially etched. In FIG. 3H, the depth (in the z-axis) of partially etching in the hardmask 120 may be in the range of 10-15 nm (after having etched away the first and second spacers 130 and 140).

By etching the first spacer 120, second spacer 130, and hardmask 120, the plurality of n-p bumps 150 are created. The n-p bumps 150 have a bump height "h" in the z-axis. The height h of the n-p bump 150 is a pillar comprising a vertically extended portion of the hardmask 120, the first spacer 130 on top of the vertically extended portion of hardmask 120, and the second spacer 140 on top of the first spacer 130.

In one case, the n-p bumps 150 may have a height "h" of 30-50 nanometers. In another case, the n-p bumps may have a height "h" of in the range of 10-15 nm. The n-p bumps 150 may have a bump width "d" (in the x axis) of in the range of 15-30 nm.

In one embodiment of the macro 300, for whichever bump height "h" and bump width "d" are chosen, each of the n-p bumps 150 are fabricated to be uniform (consistent) in bump height and bump width. That is, the bump height "h" is the same for each of the n-p bumps 150 on the macro 300, and the bump width "d" is the same for each of the n-p bumps 150 on the macro 300.

Figure 4A:
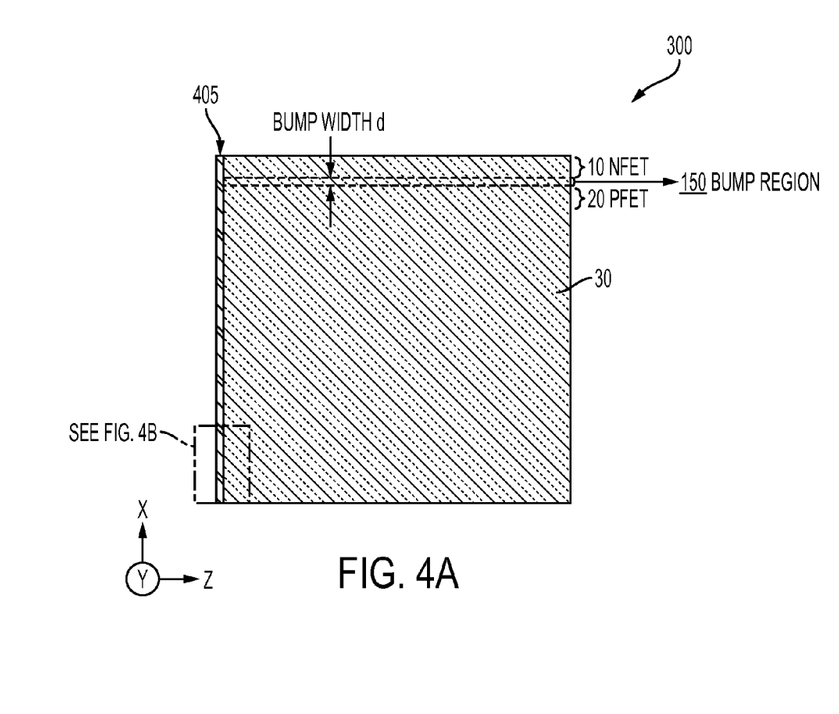
FIGS. 4A and 4B illustrate abbreviated conceptual views of arrays with variable bump widths in the macro according to an embodiment.
Figure 4B:
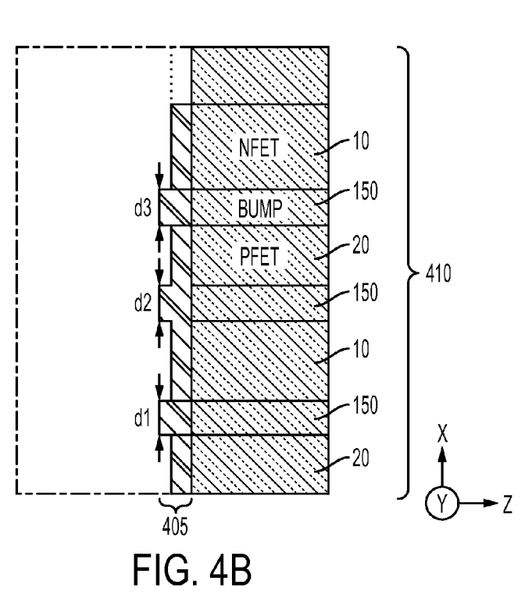
Figure 5A:
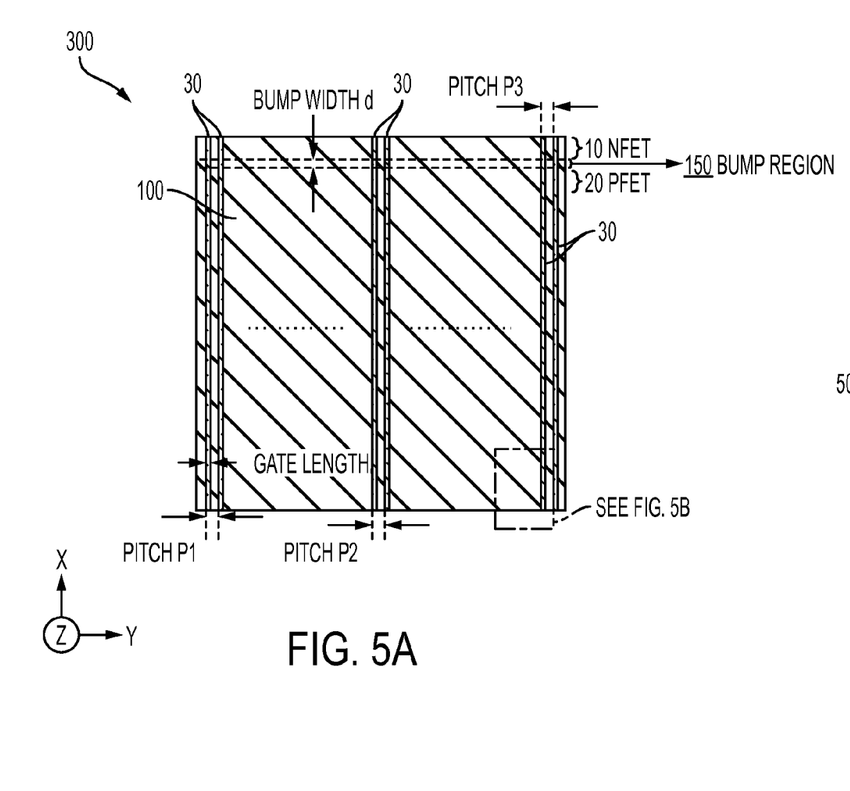
FIGS. 5A and 5B illustrate abbreviated conceptual views of arrays with variable bump widths, variable gate lengths, and variable gate pitches in the macro according to an embodiment.
Figure 5B:
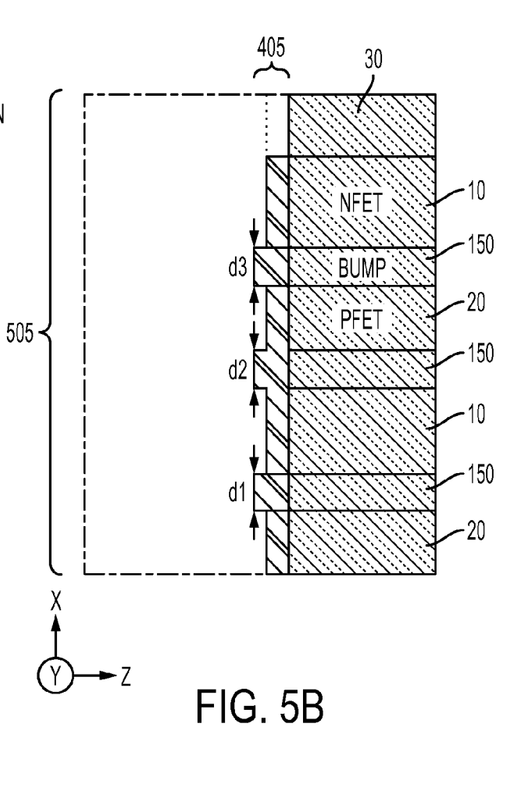

In another embodiment, the bump width "d" may vary for the n-p bumps 150 on the macro 300, while the bump height "h" does not vary as shown in FIGS. 4A and 4B. In one embodiment, the bump width "d" may vary, the gate length may vary, and the gate pitch between gates 30 may vary, while the while the bump height "h" does not vary as shown in FIGS. 5A and 5B.

Figure 3I:
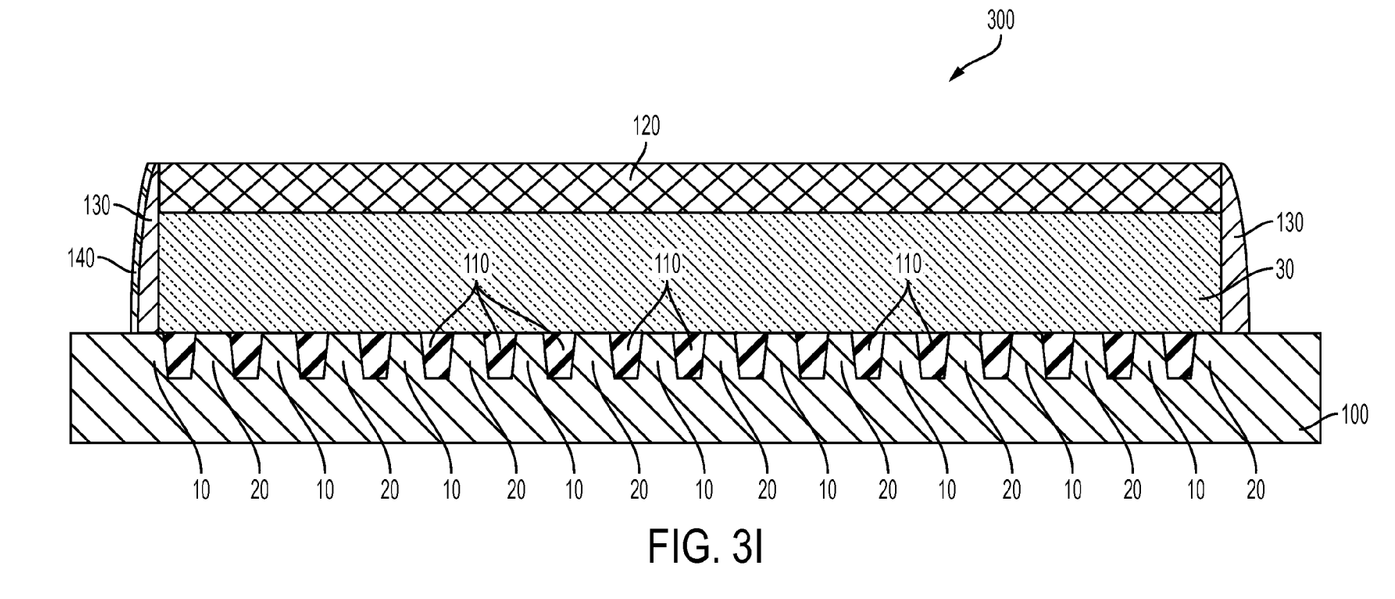
FIG. 3I is a cross-sectional view of the macro after performing optical critical dimension measurements and accordingly performing chemical mechanical polishing to remove the n-p bumps.

Now referring to FIG. 3I, the macro 300 is shown after performing optical critical dimension measurements on the n-p bumps 150 by the OCD machine 605, and accordingly, performing chemical mechanical polishing to remove the n-p bumps by the CMP machine 610. As can be seen, the n-p bumps 150 have been planarized down to the hardmask 120 to provide a smooth surface for subsequent processing. As noted above, the information collected from the macro 300 during OCD measurements by the OCD machine 605 include the spacer thickness of both the first and second spacers 130 and 140 on top of gate hardmask 105. Also, the OCD measurements include the thickness (i.e., height "h" in the z-axis) of the bumps 150 which are formed by the spacer thickness of the first and second spacers 130 and 140 combined with the extended portions of hardmask 120 forming the bump 150.

The OCD machine 605 measures the bump height "h", bump width "d", the depth of the n-p bumps 150, and the spacing between the n-p bumps 150 (i.e., corresponding to the bump pitch). The pattern and local density of the underlying material greatly affects the effectiveness of polishing, and affects the so called "loading effect" in which a denser array of gates from smaller pitches and/or a larger bump width require additional over polish to ensure the complete removal of the material (i.e., comprising the bump 150) which otherwise will cause chip yield and performance degradation. Accordingly, the macro 300 itself provides a technique of monitoring the removal of the bump 150 in various patterns, and this can provide early detection on any process drift or layout dependent issues, e.g., via repeated OCD measurements of the macro 300; the OCD measurements feedback to the polishing parameters for fine tuning during the wafer processing before the yield/performance impact is observed on the final production. In other words, the macro 300 is monitored (i.e., measured) through OCD measurements by OCD machine 605, polished by CMP machine 610, and then monitored again and polished accordingly, until the bumps 150 are removed for that particular macro 300 (i.e., the particular pattern or layout). This process can be repeated.

FIGS. 4A and 4B illustrate abbreviated conceptual views of transistor gate terminal arrays with variable bump widths "d" in the macro 300 according to an embodiment. FIGS. 4A and 4B show a combined layer 405 which includes the hardmask 120, the first spacer 130, and the second spacer 140 from FIG. 3H without delineating each layer 120, 130, 140. Since attention is directed to the n-p bumps 150, other elements are omitted, such as the substrate 100, shallow trench isolation 110, etc.

In FIGS. 4A and 4B, one side of the n-p bump region 150 is the NFET 10 and the other side of the n-p bump region 150 is the PFET 20. FIG. 4B illustrates an enlarged view 410 of a portion showing variable bump widths "d" such as d1, d2, d3 . . . to the last bump width. For example, bump width d1 may be 40 nm, bump width d2 may be 50 nm, and another bump width d3 may be 60 nm. The OCD machine 605 (shown in FIG. 6) measures the n-p bumps 150 to obtain measurements for, e.g., the height, width, and depth. Based on the measurements of the n-p bump 150, the CMP machine 610 is set to remove each of the n-p bumps 150 by polishing/planarization. The different sizes for the variable bump widths d1, d2, d3 of the n-p bumps 150 are a result of forming recesses 305 with variable widths (in the x axis) and with variable spacing between the recesses 305 in FIGS. 3E and 3F. The sizes of the bump widths "d" (which include d1, d2, d3, etc.) may range from 40-120 nm. In one implementation, the n-p bump widths "d" may alternate along the x-axis between a first bump width "d1" to a second bump "d2" such as alternating between 40 and 50 nm in the macro 300.

FIGS. 5A and 5B illustrate abbreviated conceptual views of arrays with variable bump widths "d", variable gate lengths, and variable gate pitches in the macro 300 according to an embodiment.

FIG. 5A is a top down view illustrating that there can be variable gate pitches between the dummy gates 30 such as gate pitches "p1", "p2", "p3" through the last pitch. In one implementation, the first pitch p1 may have a first distance, the second pitch p2 may have a second distance, and the third pitch p3 may have a third distance, where each of the first, second, and third distances are different.

In another implementation, two of the gate pitches p1, p2, p3 may be the same while one pitch is different. In one implementation, there can be alternating gate pitches, such as alternating between pitch p1 and p2 in a periodical pattern along the y-axis of the macro 300. Example gate pitches in the macro 300 may be in the range of 60-100 nm.

FIG. 5A also shows the gate length of the dummy gates 30 in the y-axis. Various dummy gates 30 may have different gate lengths. For example, a first dummy gate 30 may have a first gate length, a second dummy gate 30 may have a second gate length, and a third gate length may have a third gate length, where each of the first, second, and third gate lengths are different. Example gate lengths of the dummy gates 30 may be in the range of 20-50 nm. For the sake of clarity, FIG. 5A omits elements on top of the dummy gate 30 in the z-axis.

Similar to FIGS. 4A and 4B, FIG. 5B shows the combined layer 405 which includes/represents the hardmask 120, the first spacer 130, and the second spacer 140 from FIG. 3H without delineating each layer 120, 130, 140, while omitting other elements.

In FIGS. 5A and 5B, one side of the n-p bump region 150 is the NFET 10 and the other side of the n-p bump region 150 is the PFET 20. FIG. 5B illustrates an enlarged view 505 of a portion showing variable bump widths d1, d2, d3 . . . to the last bump width, which are in addition to the variable gate lengths and variable pitches. The OCD machine 605 measures the n-p bumps 150 to obtain measurements for, e.g., the height, width, and depth. The OCD machine 605 also measures the variable gate lengths and variable pitches between gates 30. Based on the measurements of the n-p bumps 150, the gate lengths, and the pitches, the CMP machine 601 is set to remove each of the n-p bumps 150 by polishing/planarization. Since the pattern and local density of the underlying material greatly affects the effectiveness of polishing, a denser array of gates from smaller pitches or larger bump widths require additional over polish to ensure the complete removal of the material as (first) determined by measuring and polishing the macro 300, before forming the actual dual spacer, dual epitaxial transistor devices 650 in FIG. 6.

FIG. 6 is a block diagram of a system 600 according to an embodiment. The system 600 includes the OCD machine 605, the CMP machine 610, the macro 300 (test layout structure), and actual dual spacer, dual epitaxial transistor devices 650.

The OCD machine 605 is configured to perform material characterizations which include systems that are used to monitor the physical, optical, electrical, and material characteristics of compound semiconductor. The OCD machine 605 is configured with components that provide metrology users with stability in focus performance, allowing precise and repeatable measurements of critical device features (such as the n-p bumps 150). OCD machines can be obtained from Nanometrics Incorporated, 1550 Buckeye Drive, Milpitas, Calif. 95035.

The CMP machine 610 is configured to provide chemical mechanical planarization (CMP). CMP is a polishing process, which utilizes a chemical slurry formulation and mechanical polishing process to remove unwanted conductive or dielectric materials on the wafer, achieving a near-perfect flat and smooth surface upon which layers of integrated circuitry are built.

FIG. 6 is a block diagram to illustrate that once the macro 300 is fabricated, optical critical dimension (OCD) measurements are taken by the OCD machine 605. Particularly, the height, width, and depth of the n-p bumps 150 are taken and stored. The dimensions of the OCD measurements are passed and/or utilized to set the CMP machine 610 in order smooth away the n-p bumps 150 on the macro 300, and subsequently, polish actual dual spacer, dual epitaxial transistor devices 650 using the same polarization/polishing setting of the test macro 300. The actual dual spacer, dual epitaxial transistor devices 650 are fabricated under the same conditions (specifications) as the macro 300, such that the elements in actual dual spacer, dual epitaxial transistor devices 650 are the same as in the macro 300. The actual dual spacer, dual epitaxial transistor devices 650 have the same dimensions (height/thickness, width, depth) for elements 10, 12, 20, 22, 30, 100, 110, 120, 130, 140, 150 305, 320 as in the test macro.

Figure 7:
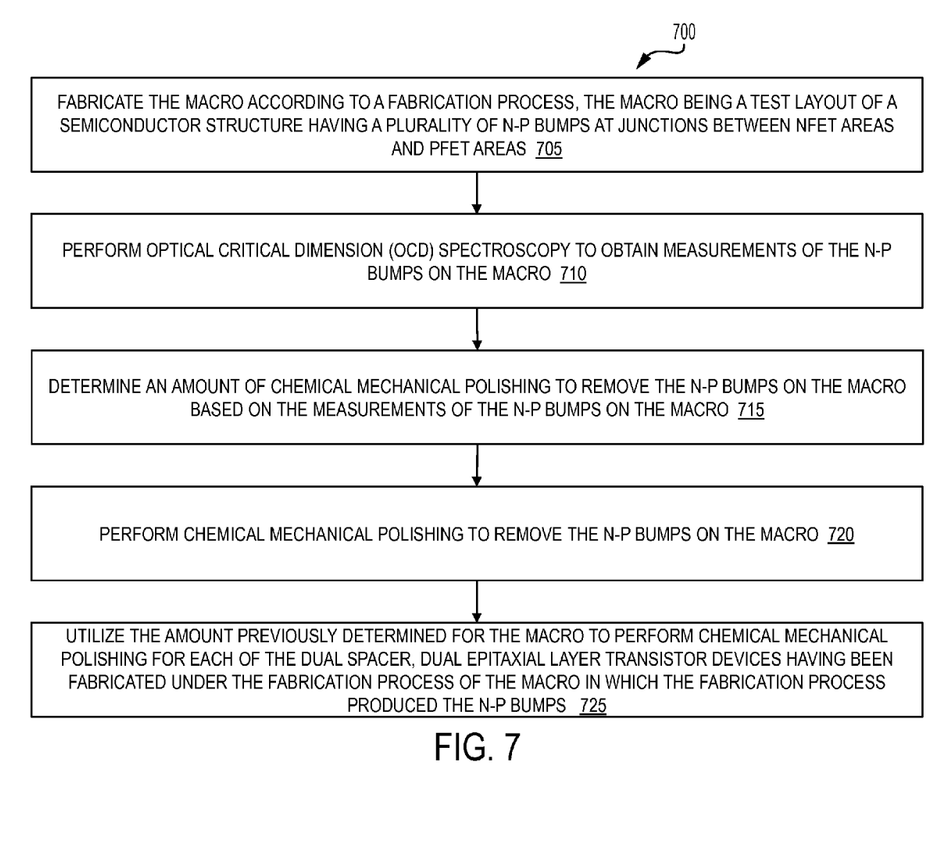
FIG. 7 is a method of fabricating a macro for measurements utilized in the actual dual spacer, dual epitaxial transistor devices according to an embodiment.

FIG. 7 illustrates a method 700 of fabricating the macro 300 for measurements utilized in the actual dual spacer, dual epitaxial transistor devices 650 according to an embodiment. Reference can be made to FIGS. 1-6.

At block 705, the macro 300 is fabricated according to a fabrication process (e.g., shown in FIGS. 2 and 3), and the macro 300 is a test layout of a semiconductor structure having a plurality of n-p bumps 150 at junctions between NFET areas 10 and PFET areas 20.

At block 710, optical critical dimension (OCD) spectroscopy is performed via OCD machine 605 to obtain measurements of the n-p bumps on the macro. For the bumps 150, the OCD measurements may include bump height, bump width, and depth of the bump.

At block 715, an amount of chemical mechanical polishing is determined to remove the n-p bumps 150 on the macro 300 based on the measurements of the n-p bumps on the macro 300. The amount of chemical mechanical polishing includes the down force (per square inch (psi)) pressing the polishing pad down against the top of the macro 300 (i.e., against the n-p bumps 150), the backpressure (psi) pressed up against the back of the macro 300 wafer, and the polishing time to polish away the n-p bumps 150 into a planarized top surface on the macro 300. All of which is based on measuring the bumps 150 on the macro 300 one or more times via the OCD machine 605

At block 720, chemical mechanical polishing is performed via the CMP machine 610 to remove the n-p bumps 150 on the macro 300. The process of blocks 715 and 720 may be repeated as needed to remove the n-p bumps 150 on the macro 300, and then the amount of chemical mechanical polishing for the macro 300 may be utilized at parameters for the actual product, such as dual spacer, dual epitaxial layer transistor devices 650, manufactured just as the macro 300 is fabricated.

At block 725, the amount previously determined for the macro 300 is utilized to perform chemical mechanical polishing for each of the dual spacer, dual epitaxial layer transistor devices 650 having been fabricated under the fabrication process (in blocks 705-720) of the macro 300 in which the fabrication process produced the n-p bumps 150.

The n-p bumps 150 are raised material on the macro 150. The n-p bumps 150 are formed as a result of separately creating epitaxial layers 12 and 22 for the NFET areas 10 and the PFET areas 22. The n-p bumps 150 are formed of a hardmask 120, a first spacer 130, and a second spacer 140.

The hardmask 120, the first spacer 130, and the second spacer 140 forming the n-p bumps 150 are positioned above the shallow trench isolation regions 110. The hardmask, the first spacer, and the second spacer forming the n-p bumps 150 are positioned repeatedly between one of the NFET areas 10 and one of the PFET areas 20.

The etching process of the hardmask, the first spacer, and the second spacer results in formation of the n-p bumps 150. The etching process allows deposition of epitaxial layers 12 and 22 respectively for the NFET areas 10 and the PFET areas 20.

Fabricating the macro 300, according to the fabrication process, includes:

1) Forming a first spacer 130 on a hardmask 120, where the hardmask 120 is on top of a plurality of gates 30 and the plurality of gates 30 are on top of a substrate 100, and where the substrate 100 has the NFET areas 10 and the PFET areas 20 (as shown in FIGS. 2A, 3B, and 3C).

2) Opening up the PFET areas 20 by removing the first spacer over the PFET areas and by etching the hardmask to a first depth over the PFET areas 20 (as shown in FIGS. 2B and 3F).

3) Depositing a PFET epitaxial layer 22 in the PFET areas (as shown in FIGS. 1, 2B, 3F).

4) Forming a second spacer 140 on top of the first spacer 130 and on top of the PFET areas previously opened up (including recesses 305) as shown in FIGS. 2C and 3G.

5) Opening up the NFET areas by removing the first spacer 130 and the second spacer 140 over the NFET areas 10 and by etching the hardmask 120 to the first depth over the NFET areas.

6) Depositing an NFET epitaxial layer 12 in the NFET areas.

Additionally, the fabrication process of the dual spacer, dual epitaxial layer transistor devices 650 includes: forming the first spacer 130 and the second spacer 140 to thicknesses according to the macro 300, and etching the first spacer, the second spacer, and the hardmask to a same degree as the macro 300, which results in the dual spacer, dual epitaxial layer transistor devices 650 having the n-p bumps 150 with a same height as the macro 300. For example, the dual spacer, dual epitaxial layer transistor devices 650 are formed as shown for the macro 300 in FIGS. 2A-2D and 3A-3H to have the n-p bumps, and are then polished as shown for the macro 300 in FIG. 3I.

The n-p bumps 150 may have variable bump widths. The plurality of gates 30 may have variable gate lengths. The plurality of gates 30 may have variable gate pitches.

Figure 8:
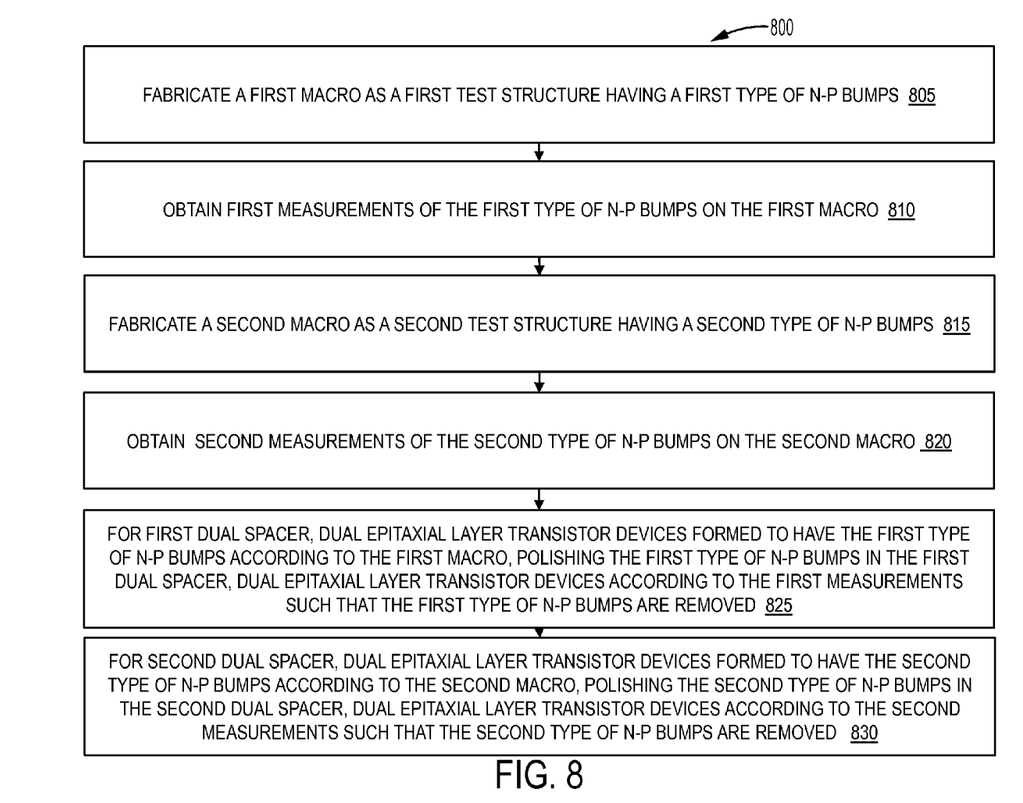
FIG. 8 is a method of configuring macros for measurements utilized in dual spacer, dual epitaxial transistor devices according to an embodiment.

FIG. 8 illustrates a method 800 of configuring macros 300 for measurements utilized in dual spacer, dual epitaxial transistor devices 650 according to an embodiment. Reference can be made to FIGS. 1-7.

At block 805, a first macro is fabricated as a first test structure having a first type of n-p bumps 150. At block 810, first measurements by the OCD machine 605 are obtained for the first type of n-p bumps 150 on the first macro 300.

At block 815, a second macro is fabricated as a second test structure having a second type of n-p bumps 150. At block 820, second measurements by the OCD machine 605 are obtained for the second type of n-p bumps 150 on the second macro 300.

The dimensions of the first type of n-p bumps 150 on the first macro 300 are different from the dimension of the second type of n-p bumps 150 on the second macro 300.

At block 825, for first dual spacer, dual epitaxial layer transistor devices 650 formed to have the first type of n-p bumps 150 according to the first macro, the first type of n-p bumps are polished/planarized in the first dual spacer, dual epitaxial layer transistor devices 650 according to the first measurements such that the first type of n-p bumps are removed.

At block 830, for second dual spacer, dual epitaxial layer transistor devices 650 formed to have the second type of n-p bumps 150 according to the second macro, the second type of n-p bumps 150 are polished/planarized in the second dual spacer, dual epitaxial layer transistor devices 650 according to the second measurements such that the second type of n-p bumps are removed.

The first dual spacer, dual epitaxial layer transistor devices 650 do not require optical critical dimension measurements to be taken for the first type of n-p bumps prior to polishing, because polishing relies of the first measurements taken for the first macro. This is because the first dual spacer, dual epitaxial layer transistor devices 650 and first macro 300 have the same dimensions for the n-p bumps 150.

The second dual spacer, dual epitaxial layer transistor devices 650 do not require optical critical dimension measurements to be taken for the second type of n-p bumps 150 prior to polishing, because polishing relies of the second measurements already taken for the second macro 300. This is because the second dual spacer, dual epitaxial layer transistor devices 650 and second macro 300 have the same dimensions for the n-p bumps 150.

The first type of n-p bumps are different from the second type of n-p bumps. The first type of n-p bumps have consistent bump widths, and the second type of n-p bumps have variable bump widths.

The first macro includes a first plurality of gates, the second macro includes a second plurality of gates, and gate lengths of the first plurality of gates are different from the second plurality of gates.

The first macro includes a first plurality of gates, the second macro includes a second plurality of gates, and gate pitches of the first plurality of gates are different from the second plurality of gates.

It will be noted that various semiconductor device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of fabricating a macro for measurements utilized in dual spacer, dual epitaxial transistor devices, the method comprising:
    fabricating the macro according to a fabrication process, the macro being a test layout of a semiconductor structure having n-p bumps at junctions between NFET areas and PFET areas;
    performing optical critical dimension (OCD) spectroscopy to obtain the measurements of the n-p bumps on the macro;
    determining an amount of chemical mechanical polishing to remove the n-p bumps on the macro based on the measurements of the n-p bumps on the macro;
    performing chemical mechanical polishing to remove the n-p bumps on the macro; and
    utilizing the amount previously determined for the macro to perform chemical mechanical polishing for each of the dual spacer, dual epitaxial layer transistor devices having been fabricated under the fabrication process of the macro in which the fabrication process produced the n-p bumps.

2. The method of claim 1, wherein the n-p bumps are raised material on the macro.

3. The method of claim 1, wherein the n-p bumps are formed as a result of separately creating epitaxial layers for the NFET areas and the PFET areas.

4. The method of claim 1, wherein the n-p bumps are formed of a hardmask, a first spacer, and a second spacer.

5. The method of claim 4, wherein the hardmask, the first spacer, and the second spacer forming the n-p bumps are positioned above a shallow trench isolation region.

6. The method of claim 5, wherein the hardmask, the first spacer, and the second spacer forming the n-p bumps are positioned between one of the NFET areas and one of the PFET areas.

7. The method of claim 6, wherein an etching process of the hardmask, the first spacer, and the second spacer results in formation of the n-p bumps.

8. The method of claim 7, wherein the etching process allows deposition of epitaxial layers for the NFET areas and the PFET areas.

9. The method of claim 1, wherein fabricating the macro, according to the fabrication process, includes:
    forming a first spacer on a hardmask, wherein the hardmask is on top of a plurality of gates and the plurality of gates are on top of a substrate, the substrate having the NFET areas and the PFET areas;
    opening up the PFET areas by removing the first spacer over the PFET areas and by etching the hardmask to a first depth over the PFET areas;
    depositing a PFET epitaxial layer in the PFET areas;
    forming a second spacer on top of the first spacer and on top of the PFET areas previously opened up;
    opening up the NFET areas by removing the first spacer and the second spacer over the NFET areas and by etching the hardmask to the first depth over the NFET areas; and
    depositing a NFET epitaxial layer in the NFET areas.

10. The method of claim 9, wherein the fabrication process of the dual spacer, dual epitaxial layer transistor devices includes:
    forming the first spacer and the second spacer to thicknesses according to the macro,
    etching the first spacer, the second spacer, and the hardmask to a same degree as the macro, which results in the dual spacer, dual epitaxial layer transistor devices having the n-p bumps with a same height as the macro.

11. The method of claim 10, wherein the plurality of gates have variable gate lengths.

12. The method of claim 9, wherein the n-p bumps have variable bump widths.

13. The method of claim 12, wherein the plurality of gates have variable gate pitches.

14. A method of configuring macros for measurements utilized in dual spacer, dual epitaxial transistor devices, the method comprising:
    fabricating a first macro as a first test structure having a first type of n-p bumps;
    obtaining first measurements of the first type of n-p bumps on the first macro;
    fabricating a second macro as a second test structure having a second type of n-p bumps;
    obtaining second measurements of the second type of n-p bumps on the second macro;
    for first dual spacer, dual epitaxial layer transistor devices formed to have the first type of n-p bumps according to the first macro, polishing the first type of n-p bumps in the first dual spacer, dual epitaxial layer transistor devices according to the first measurements such that the first type of n-p bumps are removed; and
    for second dual spacer, dual epitaxial layer transistor devices formed to have the second type of n-p bumps according to the second macro, polishing the second type of n-p bumps in the second dual spacer, dual epitaxial layer transistor devices according to the second measurements such that the second type of n-p bumps are removed.

15. The method of claim 14, wherein the first dual spacer, dual epitaxial layer transistor devices do not require optical critical dimension measurements to be taken for the first type of n-p bumps prior to polishing, because polishing relies of the first measurements taken for the first macro.

16. The method of claim 14, wherein the second dual spacer, dual epitaxial layer transistor devices do not require optical critical dimension measurements to be taken for the second type of n-p bumps prior to polishing, because polishing relies of the second measurements taken for the second macro.

17. The method of claim 14, wherein the first type of n-p bumps are different from the second type of n-p bumps.

18. The method of claim 14, wherein the first type of n-p bumps have consistent bump widths; and
 wherein the second type of n-p bumps have variable bump widths.

19. The method of claim 14, wherein the first macro includes a first plurality of gates;
 wherein the second macro includes a second plurality of gates; and
 wherein gate lengths of the first plurality of gates are different from the second plurality of gates.

20. The method of claim 14, wherein the first macro includes a first plurality of gates;
 wherein the second macro includes a second plurality of gates; and
 wherein gate pitches of the first plurality of gates are different from the second plurality of gates.

* * * * *